(12) United States Patent
Kunimoto

(10) Patent No.: US 8,318,543 B2
(45) Date of Patent: Nov. 27, 2012

(54) METHOD OF MANUFACTURING SEMICONDUCTOR DEVICE

(75) Inventor: Yuji Kunimoto, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 69 days.

(21) Appl. No.: 12/614,628

(22) Filed: Nov. 9, 2009

(65) Prior Publication Data

US 2010/0120204 A1  May 13, 2010

(30) Foreign Application Priority Data

Nov. 11, 2008 (JP) .................................. 2008-288396

(51) Int. Cl.
*H01L 21/00* (2006.01)
(52) U.S. Cl. ......... 438/118; 438/106; 438/125; 438/126
(58) Field of Classification Search .................. 438/106, 438/118, 125, 126
See application file for complete search history.

(56) References Cited

U.S. PATENT DOCUMENTS

| | | | | |
|---|---|---|---|---|
| 5,353,498 | A * | 10/1994 | Fillion et al. | 29/840 |
| 6,271,469 | B1 * | 8/2001 | Ma et al. | 174/521 |
| 6,734,534 | B1 * | 5/2004 | Vu et al. | 257/668 |
| 7,074,696 | B1 * | 7/2006 | Frankowsky et al. | 438/464 |
| 7,112,467 | B2 * | 9/2006 | Eichelberger et al. | 438/106 |
| 7,345,365 | B2 * | 3/2008 | Lee et al. | 257/724 |
| 7,663,215 | B2 * | 2/2010 | Tuominen et al. | 257/686 |
| 7,863,762 | B2 * | 1/2011 | Sheats | 257/787 |
| 7,868,445 | B2 * | 1/2011 | Kohl et al. | 257/690 |
| 7,915,076 | B2 * | 3/2011 | Ogawa et al. | 438/106 |

FOREIGN PATENT DOCUMENTS

JP 7-7134 1/1995

* cited by examiner

*Primary Examiner* — Bac Au
(74) *Attorney, Agent, or Firm* — Drinker Biddle & Reath LLP

(57) ABSTRACT

A chip is bonded onto a flat face of a first support through a first bonding layer with a terminal surface of the chip turned toward the flat face of the first support. A second support is bonded onto the chip through a second bonding layer. The first support is peeled from the chip to expose the terminal surface of the chip. An insulating layer from which the terminal surface of the chip is exposed is formed on the second support.

10 Claims, 11 Drawing Sheets

METHOD OF MANUFACTURING SEMICONDUCTOR DEVICE

This application claims priority to Japanese Patent Application No. 2008-288396, filed Nov. 11, 2008, in the Japanese Patent Office. The Japanese Patent Application No. 2008-288396 is incorporated by reference in its entirety.

TECHNICAL FIELD

The present disclosure relates to a method for manufacturing a semiconductor device, and more particularly to a technique which is effective by an application to a manufacture of a resin sealing package for sealing a plurality of electronic components.

RELATED ART

For a semiconductor device to be provided in an electronic apparatus such as a personal computer, a high reliability is demanded in addition to an increase in an integration, an enhancement in a function and a reduction in a size. The semiconductor device is constituted by a package which is subjected to resin sealing to protect various electronic components such as an IC chip (a semiconductor chip) and a chip capacitor and a wiring for electrically connecting the respective electronic components in combination thereof.

JP-A-7-7134 Publication (Patent Document 1) has disclosed a technique for enabling terminal surfaces of a plurality of chips to be positioned on a plane in an integrated circuit module (a semiconductor device) provided with the chips.

[Patent Document 1] JP-A-7-7134 Publication

SUMMARY

The inventor has investigated a technique for manufacturing a semiconductor device constituted by a package (a resin sealing package) for resin sealing an electronic component. An investigated example will be described below with reference to the drawings. FIGS. 19 to 22 are sectional views typically showing a semiconductor device in a manufacturing process which was investigated by the inventor. In the application, a chip-like electronic component will be referred to as a "chip".

First of all, as shown in FIG. 19, chips 3 and 5 are bonded to a support 101 through a bonding layer 102. A terminal surface 4a of a terminal 4 provided on a surface of the chip 3 and a terminal surface 6a of a terminal 6 provided on a surface of the chip 5 are disposed in contact with a temporary fixing surface 102a of the bonding layer 102 possessed by the support 101. Thus, the chips 3 and 5 are temporarily fixed onto the support 101 with the terminal surfaces 4a and 6a provided on a lower side.

The support 101 takes a shape of a plate and the temporary fixing surface 102a of the bonding layer 102 provided on a surface thereof has a plane. For this reason, the terminal surface 4a of the chip 3 and the terminal surface 6a of the chip 5 are provided in contact with the same plane of the temporary fixing surface 102a.

As shown in FIG. 20, subsequently, the chips 3 and 5 are sealed with a resin over the support 101 and the resin is cured. Consequently, the chips 3 and 5 are covered with a sealing resin 103.

As shown in FIG. 21, next, the support 101 is peeled from the chips 3 and 5. Consequently, the terminal surfaces 4a and 6a which are provided in contact with the temporary fixing surface 102a are exposed. Moreover, a surface of the sealing resin 103 which is provided in contact with the temporary fixing surface 102a is exposed. The surface serves as a wiring surface 103a on which a wiring layer is to be formed at a subsequent step. Thus, an identical wiring surface to the terminal surfaces 4a and 6a is formed.

As shown in FIG. 22, then, a multilayered wiring layer 104 connected electrically to the terminals 4 and 6 is formed on the wiring surface 103a through an insulating layer by a buildup method and a solder resist 105 having an uppermost wiring layer exposed is thereafter formed. Thus, a semiconductor device is finished.

In the semiconductor device using the manufacturing technique, the inventor newly found that the following problem is caused.

As described with reference to FIG. 20, the resin is soaked into a portion between the terminal surfaces 4a and 6a and the bonding layer 102 by a resin sealing pressure so that the terminal surfaces 4a and 6a are contaminated when the sealing resin 103 is to be formed. In the case in which a bonding force of the bonding layer 102 is increased to prevent the resin from being soaked out, moreover, the bonding layer 102 is not perfectly peeled from the terminal surfaces 4a and 6a so that the terminal surfaces 4a and 6a are contaminated. When the sealing resin 103 or the bonding layer 102 is maintained to be stuck to the terminal surfaces 4a and 6a, furthermore, it is impossible to flatly form the wiring layer 104 in the case in which stacking is carried out by the buildup method. Although the contamination of the terminal surfaces 4a and 6a can also be removed by cleaning, a step thereof is required so that the number of steps is increased.

Exemplary embodiments of the present invention provide a method for manufacturing a semiconductor device which can prevent the terminal surface of the terminal possessed by the chip from being contaminated. Further, exemplary embodiments of the present invention provide a method for manufacturing a semiconductor device which can ensure a flatness of a wiring surface for forming the wiring layer.

A method of manufacturing a semiconductor device according to an exemplary embodiment of the invention comprises steps of:

bonding a chip onto a flat face of a first support through a first bonding layer with a terminal surface of the chip turned toward the flat face of the first support;

bonding a second support onto a back face of the chip through a second bonding layer;

peeling the first support from the chip to expose the terminal surface of the chip; and forming, on the second support, an insulating layer from which the terminal surface of the chip is exposed.

A method of manufacturing a semiconductor device according to an exemplary embodiment of the invention comprises steps of:

bonding a chip onto a flat face of a first support through a first bonding layer with a terminal surface of the chip turned toward the flat face of the first support without a terminal of the chip and the first bonding layer provided in contact with each other;

bonding a second support onto a back face of the chip through a second bonding layer;

peeling the first support from the chip to expose the terminal surface of the chip; and forming, on the second support, an insulating layer from which the terminal surface of the chip is exposed.

The second bonding layer may have a greater bonding force than the first bonding layer. In this case, it is possible to easily peel the first support with the chip bonded to the second support.

The method may further comprise a step of forming a multilayer wiring on the insulating layer. In this case, it is possible to form a flat multilayer wiring.

A plurality of chips may be provided. In this case, it is possible to dispose terminal surfaces of the chips in alignment with each other.

According to the exemplary embodiments of the invention, it is possible to prevent the terminal surface of the terminal possessed by the chip from being contaminated. Consequently, it is possible to enhance a connecting reliability of the chip and a wiring layer to be connected thereto. Moreover, it is possible to ensure a flatness of a wiring surface for forming the wiring layer.

Other features and advantages may be apparent from the following detailed description, the accompanying drawings and the claims.

DETAILED DESCRIPTION

Figure 1:
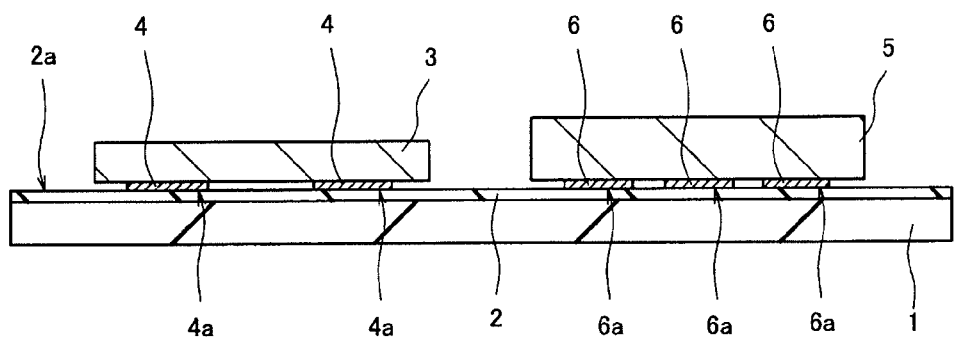
FIGS. 1 to 8 are sectional views typically showing the semiconductor device in a manufacturing process according to a first embodiment of the invention.

Embodiments according to the invention will be described below in detail with reference to the drawings. In all of the drawings for explaining the embodiments, members having the same functions have the same reference numerals and repetitive description thereof will be omitted in some cases.
(First Embodiment)

A technique for manufacturing a semiconductor device for sealing a chip (an electronic component) according to a first embodiment will be described with reference to the drawings. FIGS. 1 to 8 are sectional views typically showing the semiconductor device in a manufacturing process according to the first embodiment of the invention.

First of all, as shown in FIG. 1, a support 1 having a bonding layer 2 is prepared. The support 1 takes a shape of a plate and has a front face (a flat face) and a back face (a flat face). For this reason, a surface (a temporary fixing surface 2a) of the bonding layer 2 provided on the front face of the support 1 is also a plane. It is possible to apply a semiconductor (for example, silicon) substrate, a metal (for example, copper) substrate or a glass substrate to the support 1. The bonding layer 2 is a film using a thermosetting resin as a bonding material, for example, and is stuck (bonded) to the whole front face of the support 1.

Subsequently, a plurality of chips (chips 3 and 5) is bonded onto the front face of the support 1 through the bonding layer 2 with terminal surfaces 4a and 6a of the chips 3 and 5 turned toward the front face of the support 1. More specifically, a terminal 4 is provided on a surface of the chip 3 turned toward the front face of the support 1, a terminal 6 is provided on a surface of the chip 5 turned toward the front face of the support 1, the terminal surface 4a of the terminal 4 and the terminal surface 6a of the terminal bare disposed in contact with the temporary fixing surface 2a of the bonding layer 2 to bond (temporarily fix) the chips 3 and 5 to the support 1 through the bonding layer 2. In this case, the chips 3 and 5 can also be disposed with the terminal surfaces 4a and 6a aligned with each other.

It is sufficient that the bonding layer 2 for temporarily fixing the support 1 to the chips 3 and 5 is formed by a material having a minimum bonding force for holding the chips 3 and 5 so as not to be moved when a bonding layer different from the bonding layer 2 is bonded to the chips 3 and 5 at a subsequent step. Thus, the chips 3 and 5 are temporarily fixed onto the support 1 with the terminal surfaces 4a and 6a provided on a lower side in order to peel the support 1 from the chips 3 and 5 at a subsequent step.

In the temporary fixation, the terminal surface 4a of the chip 3 and the terminal surface 6a of the chip 5 are provided in contact with the same plane of the temporary fixing surface 2a. Also in the case in which the support 1 is peeled at a subsequent step, therefore, the terminal surface 4a of the chip 3 and the terminal surface 6a of the chip 5 are disposed on the same plane in alignment with each other. Also in the case in which the semiconductor device has a plurality of chips, terminal surfaces of the chips are disposed on the same plane in alignment with each other. Consequently, it is possible to flatly form a wiring layer on the terminal surface at a subsequent step.

The invention can also be applied to the case in which thicknesses of the chips to be sealed in the semiconductor device are equal to each other and the case in which they are different from each other. Thus, the same advantages can be obtained. In the embodiment, description will be given to the case in which the chips 3 and 5 have different thicknesses from each other. FIG. 1 shows the case in which the chip 5 is thicker than the chip 3. For the case in which the thicknesses of the chips are different from each other, for example, it is also possible to propose the case in which the thicknesses are different from each other because of a variation in a function and the case in which the thicknesses are different from each other because of a manufacturing variation even if the same function is applied. Also in the case in which the chips having different thicknesses are sealed as shown in FIG. 1, the terminal surface 4a of the chip 3 and the terminal surface 6a of the chip 5 are disposed on the same plane in alignment with each other.

Subsequently, there is prepared a support 7 including a bonding layer 8 (8a, 8b) having a greater bonding force than the bonding layer 2 (see FIG. 2). The support 7 is a substrate of the semiconductor device according to the embodiment and a plurality of chips and a wiring layer are provided on the substrate (the support 7).

The support 7 takes a shape of a plate and has a front face and a back face. For this reason, a surface of the bonding layer 8 provided on the front face of the support 7 is also a plane. The support 7 constitutes a part of the semiconductor device as the substrate and has a function of a stiffener for preventing a warpage of a package and a heat spreader for a heat radiation. A semiconductor (for example, silicon) substrate, a carbon substrate, a metal (for example, copper) substrate and a glass substrate can be applied to the support 7 in order to enhance a mechanical strength and a heat radiating property of the package.

The bonding layer 8 is a film using a thermosetting resin as a bonding material, for example, and is cut to have a predetermined size and is thus stuck (bonded) to the support 7. The bonding layer 8 is formed to have a greater bonding force than the bonding layer 2. A thickness of the bonding layer 8 is approximately 10 µm, for example.

The bonding layer 8 can also be provided over the whole front face of the support 7 in the same manner as the bonding layer 2 of the support 1. However, it is preferable that the bonding layer 8 (8a, 8b) should be present in a region for bonding back faces of the chips 3 and 5 at a subsequent step. In the embodiment, therefore, the bonding layer 8 is provided in a part of the support 7. Consequently, it is possible to reduce a cost of a member of the bonding layer 8. In the support 1 to be fixed temporarily, the terminal surface 4a of the chip 3 and the terminal surface 6a of the chip 5 are disposed on the same plane in alignment with each other. For this reason, the bonding layer 2 is provided over the whole front face of the support 1.

Figure 2:
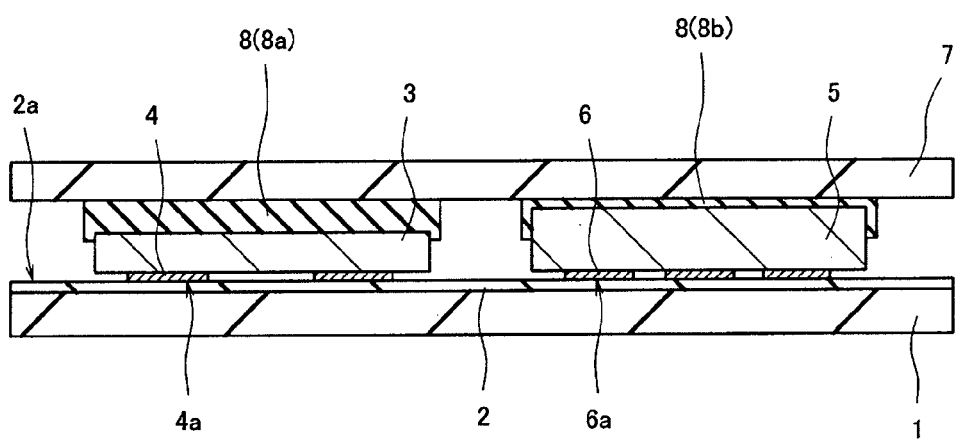

As shown in FIG. 2, next, the support 7 is bonded onto the back faces of the chips 3 and 5 through the bonding layer 8 to interpose the chips 3 and 5 together with the support 1. Also in the case in which at least the back faces of the chips 3 and 5 and the bonding layer 8 are provided in contact with each other, it is sufficient that the chips 3 and 5 and the support 7 are strongly bonded to each other through the bonding layer 8. As shown in FIG. 2, however, the bonding layer 8 is provided in contact with the back faces and a part of side surfaces in the chips 3 and 5 in such a manner that the chips 3 and 5 are embedded in (sunk into) the bonding layer 8. Thus, it is possible to bond the support 7 (the bonding layer 8) to the chips 3 and 5 more strongly. In the embodiment, the support 7 is bonded (contact bonded) to the chips 3 and 5 through the bonding layer 8 by an application of a pressure.

In the bonding work, moreover, the bonding layer 8 is concaved (sunk) to embed the chips 3 and 5 therein. Therefore, it is possible to absorb a difference in a height between the chips (the chips 3 and 5) having different thicknesses and to strongly bond them to the support 7 through the bonding layer 8.

Figure 3:
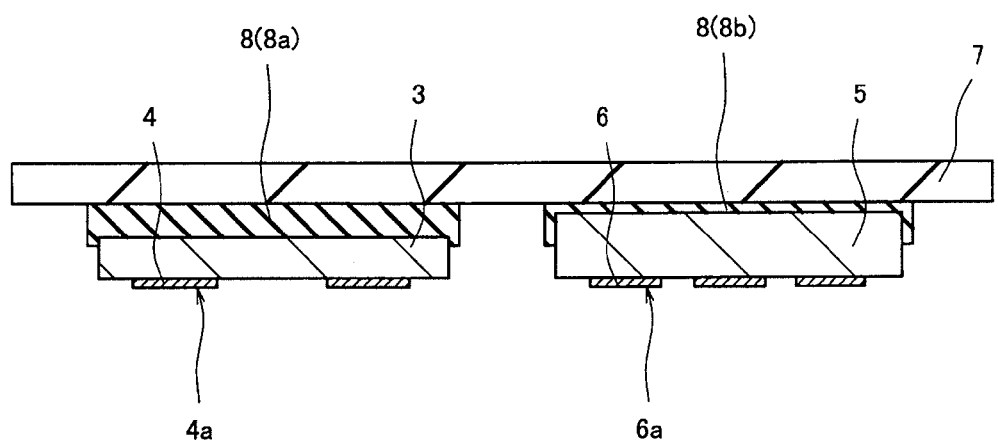

As shown in FIG. 3, subsequently, the support 1 fixed temporarily is peeled from the chips 3 and 5. Consequently, the terminal surfaces 4a and 6a of the chips 3 and 5 are exposed to the same plane in alignment with each other. Since the bonding layer 2 has a smaller bonding force than the bonding layer 8, it has an excellent peeling property from the support 1. In this case, it is possible to easily peel the support 1 with the chips 3 and 5 bonded to the support 7. Thus, it is possible to prevent the terminal surfaces 4a and 6a from being contaminated due to imperfect peeling of the bonding layer 2 because a temporary fixing force between the terminal surfaces 4a and 6a and the support 1 is small. By preventing the terminal surfaces 4a and 6a from being contaminated, moreover, it is possible to enhance a connecting reliability of the chips 3 and 5 and a wiring. Furthermore, a bonding material of the bonding layer 2 is not stuck to the terminal surfaces 4a and 6a. Therefore, it is possible to ensure a flatness of wiring surfaces (the terminal surfaces 4a and 6a) for forming a wiring layer.

Figure 4:
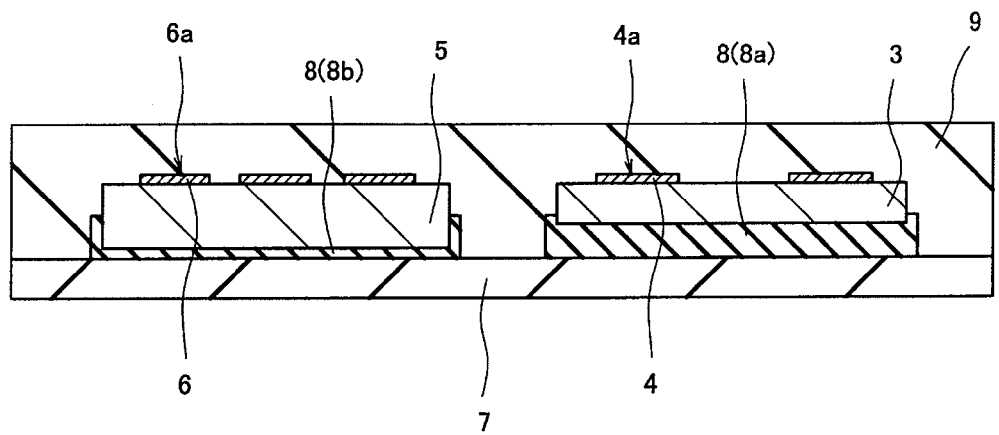

As shown in FIG. 4, then, the support 7 is inverted to turn the terminal surfaces 4a and 6a of the chips 3 and 5 upward and the chips 3 and 5 are thereafter sealed with a resin over the support 7. In other words, a sealing resin is filled and cured over the support 7 to form a sealing resin 9 for sealing the chips 3 and 5. For example, a resin molding device (which is also referred to as a transfer molding device) is used to clamp the support 7 with a metal mold so that the sealing resin 9 is formed by a resin mold (for example, a mold by an epoxy resin). Moreover, it is also possible to form the sealing resin 9 by laminating an epoxy or a polyimide based resin film and carrying out heating and pressurization.

In the embodiment, by covering surfaces of the chips 3 and 5, that is, the terminal surfaces 4a and 6a with the sealing resin 9, covering back faces (rear faces) of the chips 3 and 5 with the bonding layer 8 and covering side surfaces of the chips 3 and 5 with the sealing resin 9 and the bonding layer 8, it is possible to protect the chips 3 and 5. Moreover, the chips 3 and 5 are not wholly covered with the sealing resin 9 but are partially covered with the bonding layer 8. Consequently, it is possible to reduce an influence of curing and contraction of the resin, thereby preventing a warpage of the sealing resin 9.

Figure 5:
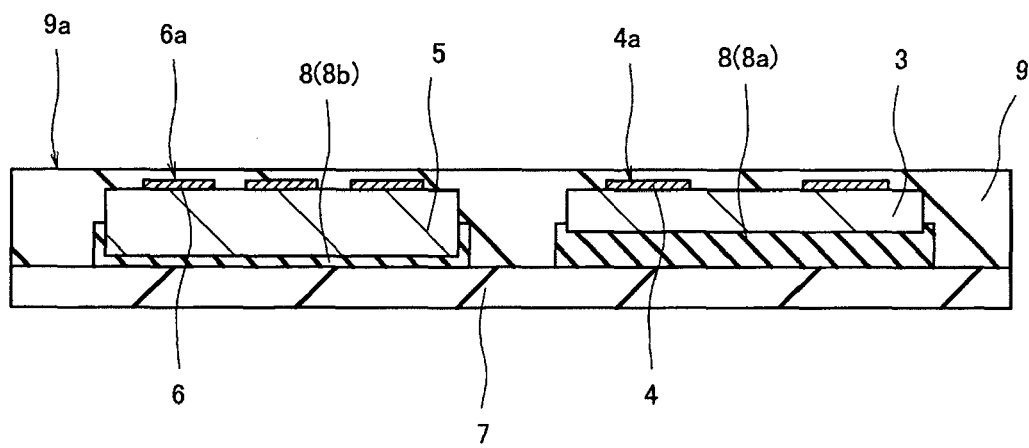
Figure 6:
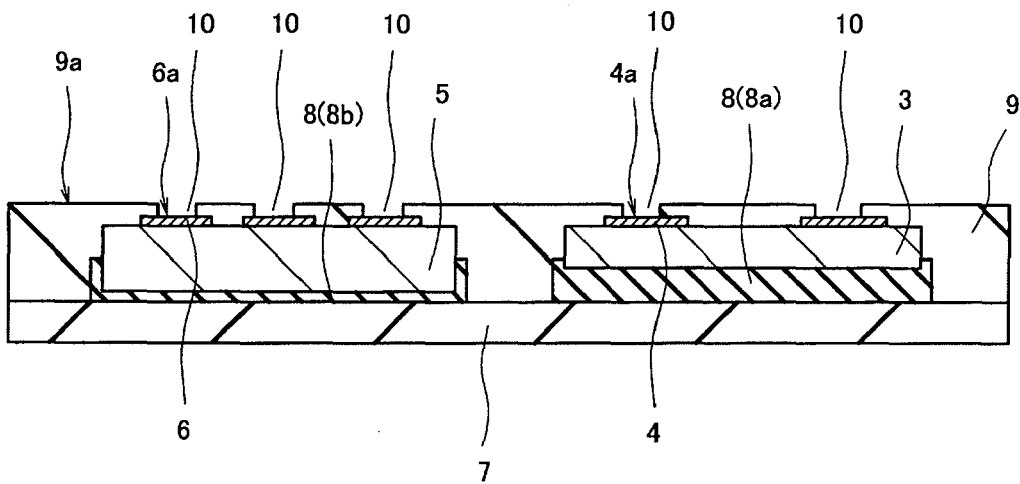

Subsequently, an insulating layer (constituted by the sealing resin 9) exposing the terminal surfaces 4a and 6a of the chips 3 and 5 is formed on the support 7 (see FIGS. 5 and 6). More specifically, as shown in FIG. 5, the cured sealing resin 9 is polished or ground from a surface thereof to this side of the terminal surfaces 4a and 6a of the chips 3 and 5. The surface of the sealing resin 9 thus polished or ground serves as a wiring surface 9a on which a wiring layer is to be formed at a subsequent step. As shown in FIG. 6, next, a through hole 10 is formed on the sealing resin 9 provided just above the terminals 4 and 6. Consequently, it is possible to expose the terminal surfaces 4a and 6a of the chips 3 and 5. For the formation of the through hole 10, for example, it is possible to use a laser processing or a photo-process.

Figure 21:
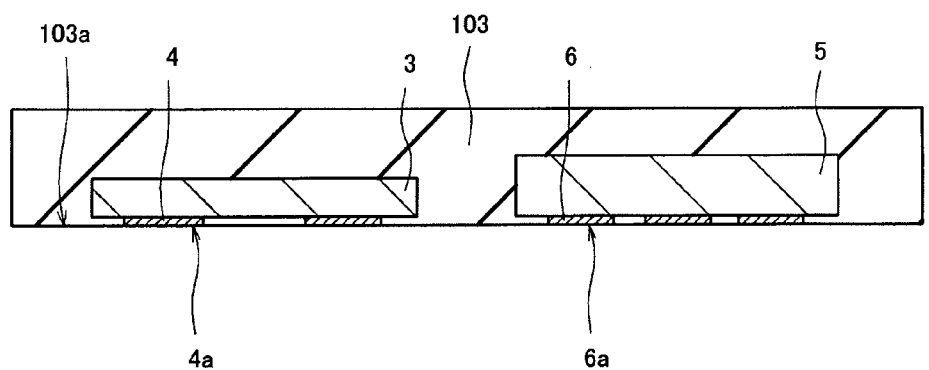
Figure 22:
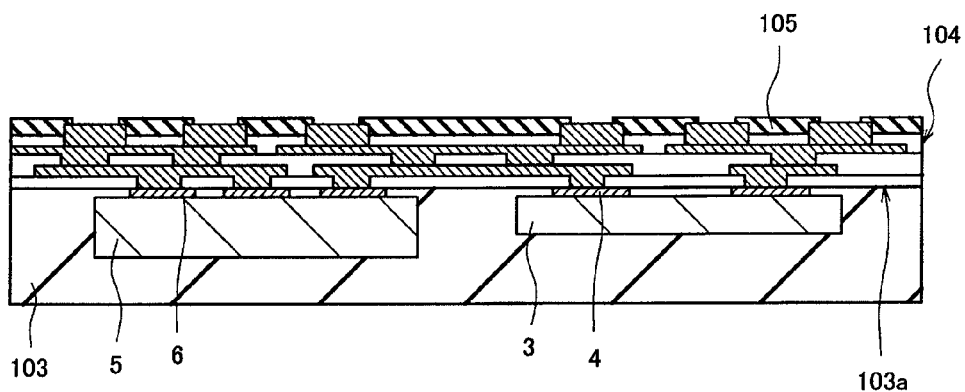

For example, in the case in which the chips 3 and 5 are wholly covered with a sealing resin 103 as shown in FIG. 21, the sealing resin 103 is warped through the curing and contraction of the resin. For this reason, it can also be supposed that a wiring surface 103a on which a wiring layer is to be formed at a subsequent step is not flat. On the other hand, in the embodiment, the back faces and a part of the side surfaces in the chips 3 and 5 are covered with the bonding layer 8 and the surfaces (the terminal surfaces 4a and 6a are exposed therefrom in FIG. 6) and the other parts of the side surfaces in the chips 3 and 5 are covered with the sealing resin 9. Therefore, it is possible to reduce the warpage which is caused by the curing and contraction of the resin. Accordingly, it is possible to ensure a flatness of the wiring surface 9a for forming a wiring layer.

Figure 7:
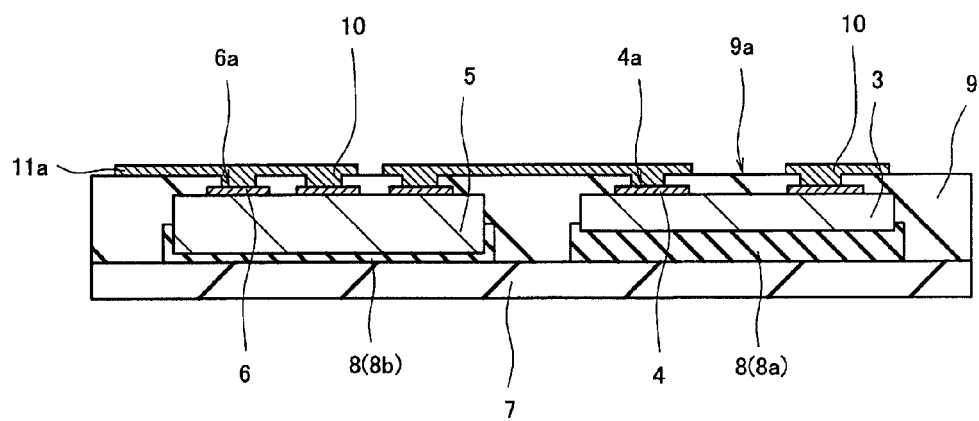
Figure 8:
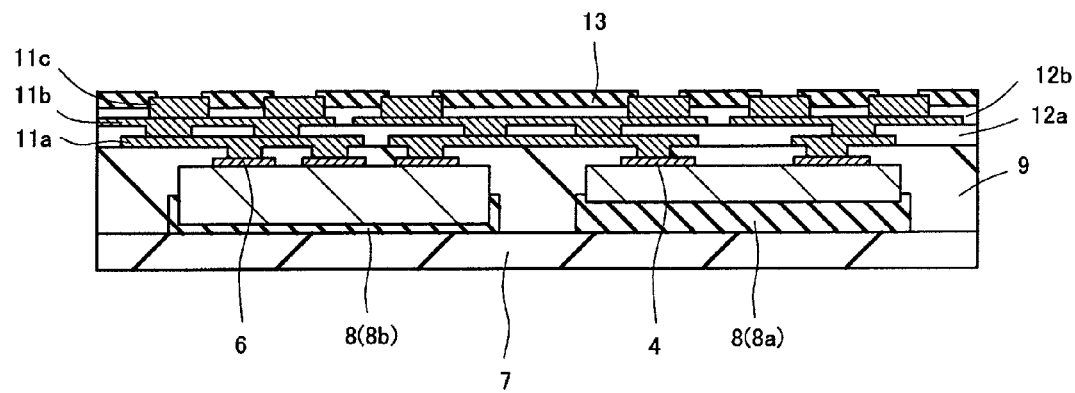

Subsequently, a multilayer wiring is formed on the sealing resin 9 (see FIGS. 7 and 8). More specifically, a first wiring layer 11a is formed by using a semiadditive method, for example, as shown in FIG. 7. In this case, the through hole 10 is also filled in so that a via (VIA) is formed, and the wiring layer 11a is electrically connected to the terminals 4 and 6 of the chips 3 and 5 through the via. As shown in FIG. 8, next, an insulating layer 12a for electrically isolating a wiring layer, a second wiring layer 11b, an insulating layer 12b and a third wiring layer 11c (an uppermost wiring layer) are formed on the first wiring layer 11a. In this case, a flatness of each of the wiring surface 9a and the terminal surfaces 4a and 6a which serve as grounds is ensured. Therefore, a flat multilayer wiring can be formed. For example, the wiring layers are made of copper, and the insulating layers are made of an epoxy or polyimide resin.

Then, a solder resist 13 exposing an uppermost wiring layer is formed so that the semiconductor device is finished. In the semiconductor device, a solder ball can be connected as an external connecting terminal onto the third wiring layer 11c to be the uppermost wiring layer.

In the case in which a thickness of the semiconductor device is to be reduced, it is also possible to further add a step of removing the support 7. For example, in the case in which the support 7 is formed of a metal, it can be removed by etching.

The semiconductor device according to the embodiment includes a plurality of chips (the chips 3 and 5). The terminal surfaces 4a and 6a of the chips 3 and 5 are disposed on the same plane (the temporary fixing surface 2a) in alignment with each other (see FIG. 1). Therefore, it is possible to ensure the flatness of the terminal surfaces 4a and 6a to be the wiring surfaces for forming the wiring layer 11a (see FIG. 7).

Although the chips 3 and 5 are bonded and temporarily fixed onto the plate-shaped support 1 through the bonding layer 2 in order to dispose the terminal surfaces 4a and 6a on the same plane in alignment with each other in the embodiment, it is possible to easily peel the support 1 which is fixed temporarily. Therefore, it is possible to prevent a contamination, for example, an adhesion of a bonding material to the terminal surfaces 4a and 6a. By preventing the terminal surfaces 4a and 6a from being contaminated, moreover, it is possible to enhance a connecting reliability of the chips 3 and 5 and the wiring. Since it is possible to prevent the terminal surfaces 4a and 6a from being contaminated, furthermore, it is possible to ensure the flatness of the terminal surfaces 4a and 6a serving as the wiring surfaces for forming the wiring layer 11a.

Moreover, the chips (the chips 3 and 5) are provided on the support 7 to be the substrate of the semiconductor device and are sealed with the sealing resin 9. However, the back faces and a part of the side surfaces of the chips 3 and 5 are covered with the bonding layer 8. Therefore, it is possible to reduce an influence of the curing and contraction of the resin, thereby preventing a warpage of the sealing resin 9. Thus, it is possible to ensure a flatness of the wiring surface 9a on which the wiring layers 11a, 11b and 11c are to be formed.

In the embodiment, furthermore, various electronic components such as an IC chip (a semiconductor chip) and a chip capacitor may be provided as the chips 3 and 5.

(Second Embodiment)

A technique for manufacturing a semiconductor device for sealing a chip (an electronic component) according to a second embodiment will be described with reference to the drawings. FIGS. 9 to 16 are sectional views typically showing the semiconductor device in a manufacturing process according to the second embodiment of the invention.

Figure 9:
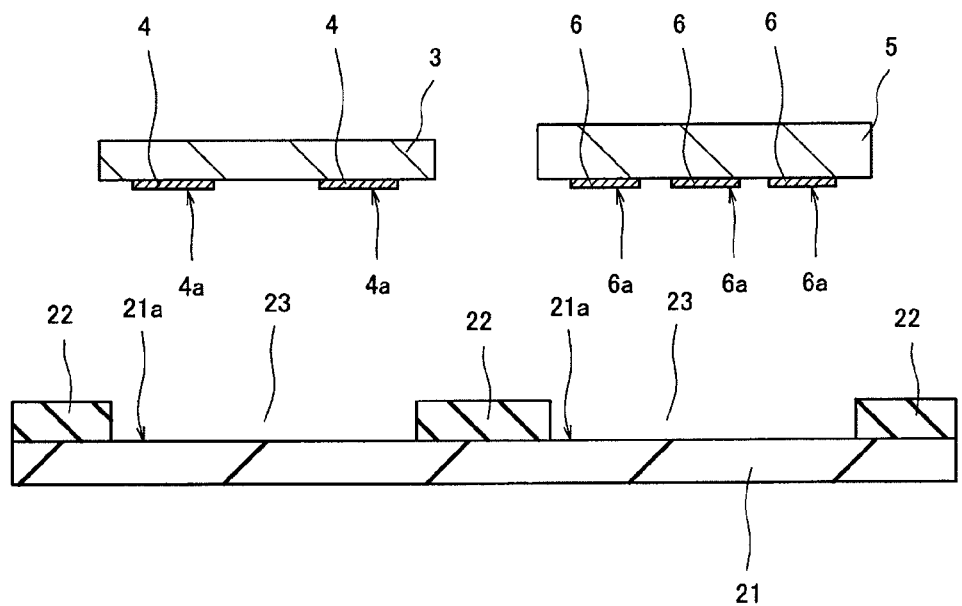
FIGS. 9 to 16 are sectional views typically showing the semiconductor device in a manufacturing process according to a second embodiment of the invention.

First of all, as shown in FIG. 9, there is prepared a support 21 having a region 23 in which a chip is to be disposed and a bonding layer 22 provided therearound. The support 21 takes a shape of a plate and has a front face (a flat face) and a back face (a flat face). For this reason, the front face (a temporary fixing surface 21a) of the support 21 in the region 23 is also a plane. It is possible to apply a semiconductor (for example, silicon) substrate, a metal (for example, copper) substrate or a glass substrate to the support 21. The bonding layer 22 is a film using a thermosetting resin as a bonding material, for example, and is stuck (bonded) to the whole front face excluding the region 23 portion of the support 21.

Figure 10:
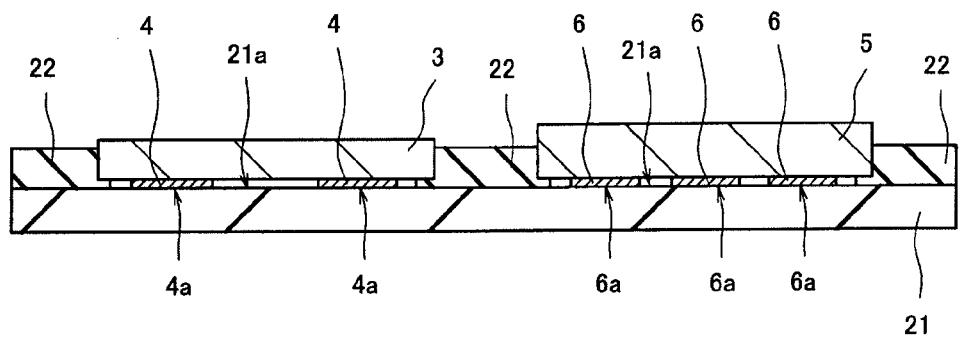

As shown in FIG. 10, subsequently, a plurality of chips (chips 3 and 5) is bonded onto the front face of the support 21 through the bonding layer 22 with terminal surfaces 4a and 6a of the chips 3 and 5 turned toward the front face of the support 21 without terminals 4 and 6 of the chips 3 and 5 provided in contact with the bonding layer 22. More specifically, the terminal 4 is provided on a surface of the chip 3 turned toward the front face of the support 21, the terminal 6 is provided on a surface of the chip 5 turned toward the front face of the support 21, and the support 21 is bonded to the chips 3 and 5 through the bonding layer 22 in a state in which the terminal surface 4a of the terminal 4 and the terminal surface 6a of the terminal 6 are disposed in contact with the temporary fixing surface 21a in the region 23. In this case, peripheral edge parts of the surfaces of the chips 3 and 5 (terminal forming portions) are bonded to the bonding layer 22. Thus, the bonding layer 22 is disposed in a position in which it is not provided in contact with the terminals 4 and 6 over the support 21.

It is sufficient that the bonding layer 22 for temporarily fixing the support 21 to the chips 3 and 5 is formed by a material having a minimum bonding force for holding the chips 3 and 5 so as not to be moved when bonding a bonding layer different from the bonding layer 22 to the chips 3 and 5 at a subsequent step. Thus, the chips 3 and 5 are temporarily fixed onto the support 21 with the terminal surfaces 4a and 6a provided on a lower side in order to peel the support 21 from the chips 3 and 5 at a subsequent step.

In the temporary fixation, the terminal surface 4a of the chip 3 and the terminal surface 6a of the chip 5 are provided in contact with the same plane of the temporary fixing surface 21a. Also in the case in which the support 21 is peeled at a subsequent step, therefore, the terminal surface 4a of the chip 3 and the terminal surface 6a of the chip 5 are disposed on the same plane in alignment with each other. Also in the case in which the semiconductor device has a plurality of chips, terminal surfaces of the chips are disposed on the same plane in alignment with each other. Consequently, it is possible to flatly form a wiring layer on the terminal surface at a subsequent step.

The invention can also be applied to the case in which thicknesses of the chips to be sealed with the semiconductor device are equal to each other and the case in which they are different from each other. Thus, the same advantages can be obtained. In the embodiment, description will be given to the case in which the chips 3 and 5 have different thicknesses from each other. Also in the case in which the chips having different thicknesses are sealed as shown in FIG. 10, the terminal surface 4a of the chip 3 and the terminal surface 6a of the chip 5 are disposed on the same plane in alignment with each other.

Subsequently, there is prepared a support 27 including a bonding layer 28 having a greater bonding force than the bonding layer 22 (see FIG. 11). The support 27 is a substrate of the semiconductor device according to the embodiment and a plurality of chips and a wiring layer are provided on the substrate (the support 27).

The support 27 takes a shape of a plate and has a front face and a back face. For this reason, a surface of the bonding layer 28 provided on the front face of the support 27 is also a plane. The support 27 constitutes a part of the semiconductor device as the substrate and has a function of a stiffener for preventing a warpage of a package and a heat spreader for a heat radiation. A semiconductor (for example, silicon) substrate, a carbon substrate, a metal (for example, copper) substrate and a glass substrate can be applied to the support 27 in order to enhance a mechanical strength and a heat radiating property of the package.

The bonding layer 28 is a film using a thermosetting resin as a bonding material, for example, and is stuck (bonded) to the whole front face of the support 27. The bonding layer 28 is formed to have a greater bonding force than the bonding layer 22. A thickness of the bonding layer 28 is approximately 10 μm, for example.

Figure 11:
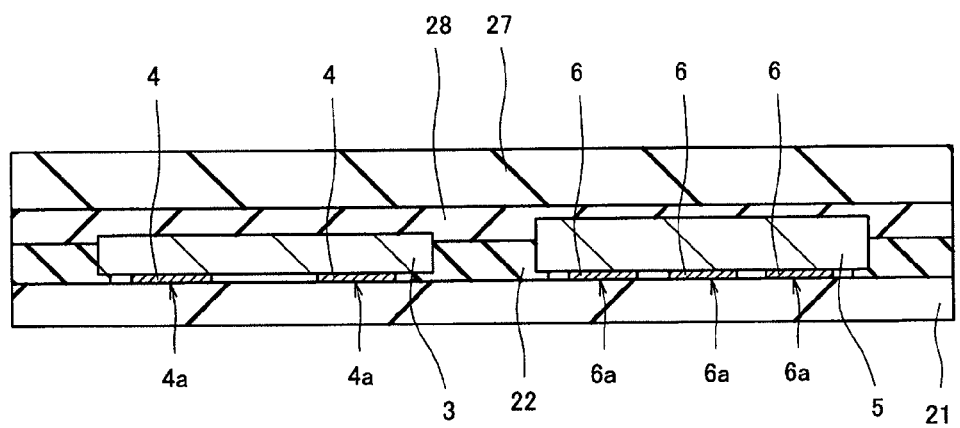

As shown in FIG. 11, next, the support 27 is bonded to the back faces of the chips 3 and 5 through the bonding layer 28 to interpose the chips 3 and 5 together with the support 21. Also in the case in which at least the back faces of the chips 3 and 5 and the bonding layer 28 are provided in contact with each other, it is sufficient that the chips 3 and 5 and the support 27 are strongly bonded to each other through the bonding layer 28. As shown in FIG. 11, however, the bonding layer 28 is provided in contact with the back faces and a part of side surfaces in the chips 3 and 5 in such a manner that the chips 3 and 5 are embedded in (sunk into) the bonding layer 28. Thus, it is possible to bond the support 27 (the bonding layer 28) to the chips 3 and 5 more strongly. In the embodiment, the support 27 is bonded (contact bonded) to the chips 3 and 5 through the bonding layer 28 by an application of a pressure.

In the bonding work, moreover, the bonding layer 28 is concaved (sunk) to embed the chips 3 and 5 therein. Therefore, it is possible to strongly bond a plurality of chips (the chips 3 and 5) having different thicknesses to the support 27 through the bonding layer 28.

Figure 12:
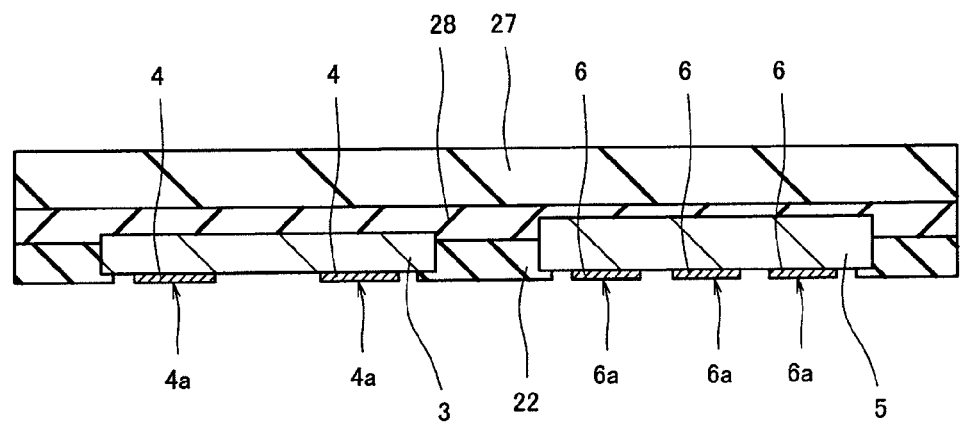

As shown in FIG. 12, subsequently, the support 21 fixed temporarily is peeled from the chips 3 and 5 with the bonding layer 22 bonded to the bonding layer 28. Consequently, the terminal surfaces 4a and 6a of the chips 3 and 5 are exposed to the same plane in alignment with each other. Since the bonding layer 22 has a smaller bonding force than the bonding layer 28, it has an excellent peeling property from the support 21. Consequently, it is possible to prevent the terminal surfaces 4a and 6a from being contaminated due to imperfect peeling of the bonding layer 22 because a temporary fixing force between the terminal surfaces 4a and 6a and the support 21 is small. By preventing the terminal surfaces 4a and 6a from being contaminated, moreover, it is possible to enhance a connecting reliability of the chips 3 and 5 and a wiring. Furthermore, a bonding material of the bonding layer 22 is not stuck to the terminal surfaces 4a and 6a. Therefore, it is possible to ensure a flatness of wiring surfaces (the terminal surfaces 4a and 6a) for forming a wiring layer.

Figure 13:
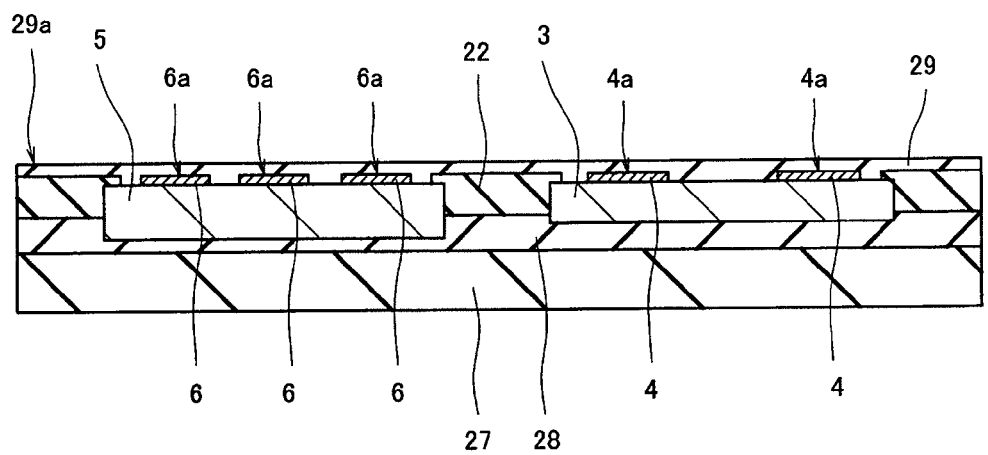

Subsequently, an insulating layer (constituted by a sealing resin 29) exposing the terminal surfaces 4a and 6a of the chips 3 and 5 is formed on the support 27 (see FIGS. 13 and 14). More specifically, as shown in FIG. 13, the support 27 is inverted and the sealing resin 29 for sealing the chips 3 and 5 is then formed on the support 27 in such a manner that the sealing resin 29 is provided on the terminal surfaces 4a and 6a of the chips 3 and 5. For example, an insulating resin is coated to cover the terminal surfaces 4a and 6a and is cured to form the sealing resin 29 for sealing the chips 3 and 5. The sealing resin 29 is also formed on the bonding layer 22. The sealing resin 29 is made of an epoxy or polyimide resin, for example.

In the embodiment, by covering surfaces of the chips 3 and 5, that is, the terminal surfaces 4a and 6a with the sealing resin 29 and covering back faces (rear faces) and side surfaces of the chips 3 and 5 with the bonding layers 22 and 28, it is possible to protect the chips 3 and 5. Moreover, the chips 3 and 5 are not wholly covered with the sealing resin 29 but are partially covered with the bonding layers 22 and 28. Consequently, it is possible to reduce an influence of curing and contraction of the resin, thereby preventing a warpage of the sealing resin 29. Therefore, it is possible to ensure a flatness of a wiring surface 29a for forming a wiring layer.

Figure 14:
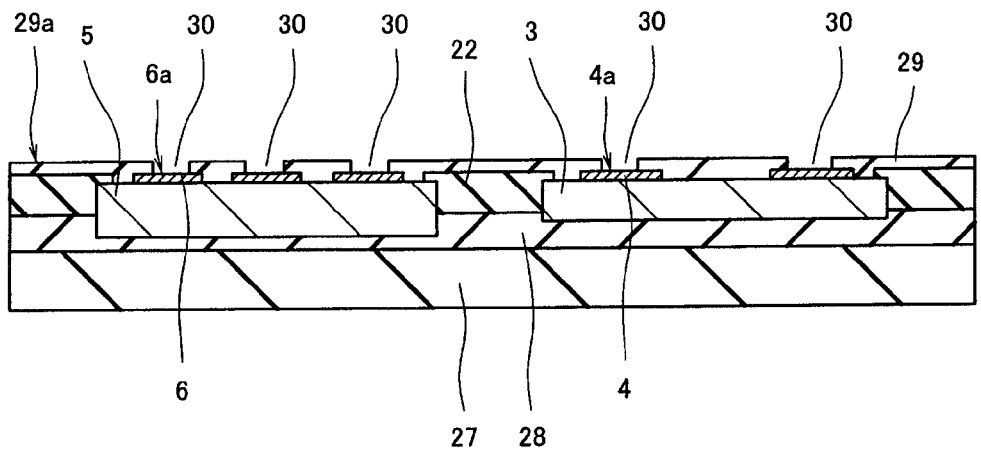

Subsequently, a through hole 30 is formed on the sealing resin 29 provided just above the terminals 4 and 6 as shown in FIG. 14. Consequently, it is possible to expose the terminal surfaces 4a and 6a of the chips 3 and 5. For the formation of the through hole 30, for example, it is possible to use a laser processing, a photo-process or imprinting.

Figure 15:
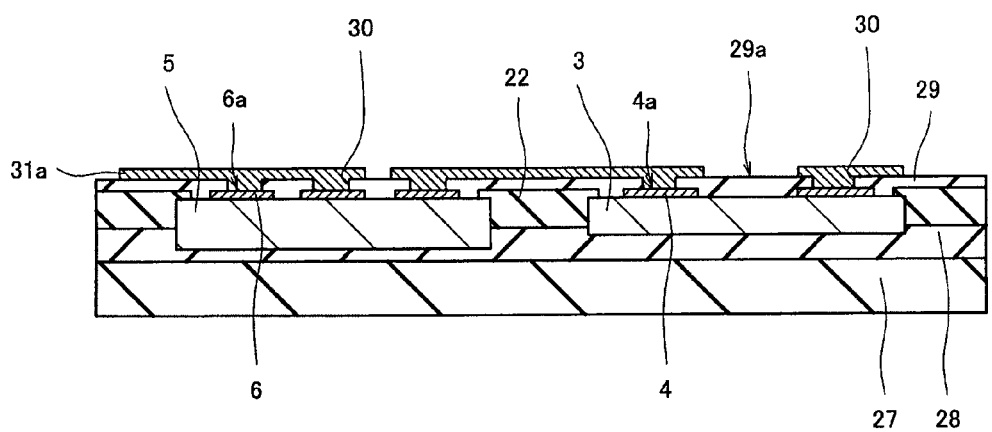
Figure 16:
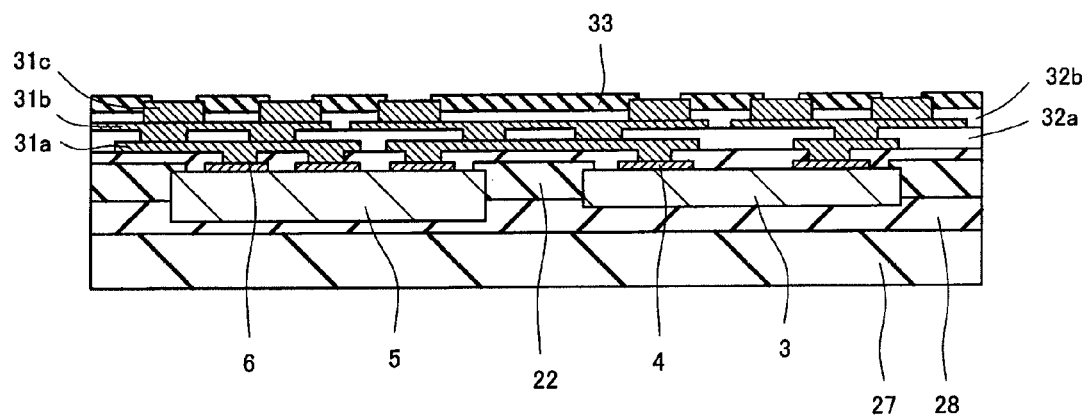

As shown in FIG. 15, next, a first wiring layer 31a is formed by using a semiadditive method, for example. In this case, the through hole 30 is also filled in so that a via (VIA) is formed, and the wiring layer 31a and the terminals 4 and 6 of the chips 3 and 5 are electrically connected to each other through the via. As shown in FIG. 16, furthermore, an insulating layer 32a for electrically isolating a wiring layer, a second wiring layer 31b, an insulating layer 32b and a third wiring layer 31c (an uppermost wiring layer) are formed on the first wiring layer 31a, and a solder resist 33 exposing the uppermost wiring layer is then formed. Thus, the semiconductor device is finished. For example, the wiring layers are made of copper, and the insulating layers are made of an epoxy or polyimide resin. In the semiconductor device, a solder ball can be connected as an external connecting terminal onto the third wiring layer 31c to be the uppermost wiring layer.

In the case in which a thickness of the semiconductor device is to be reduced, it is also possible to further add a step of removing the support 27. For example, in the case in which the support 27 is formed of a metal, the support 27 can be removed by etching.

The semiconductor device according to the embodiment includes a plurality of chips (the chips 3 and 5). The terminal surfaces 4a and 6a of the chips 3 and 5 are disposed on the same plane (the temporary fixing surface 21a) in alignment with each other (see FIG. 10). Therefore, it is possible to ensure the flatness of the terminal surfaces 4a and 6a to be the wiring surfaces for forming the wiring layer 31a (see FIG. 15).

Although the chips 3 and 5 are bonded and temporarily fixed onto the plate-shaped support 21 through the bonding layer 22 in order to dispose the terminal surfaces 4a and 6a on the same plane in alignment with each other in the embodiment, it is possible to easily peel the support 21 which is fixed temporarily. Therefore, it is possible to prevent a contamination, for example, an adhesion of a bonding material to the terminal surfaces 4a and 6a. By preventing the terminal surfaces 4a and 6a from being contaminated, moreover, it is possible to enhance a connecting reliability of the chips 3 and 5 and the wiring. Since it is possible to prevent the terminal surfaces 4a and 6a from being contaminated, furthermore, it is possible to ensure the flatness of the terminal surfaces 4a and 6a serving as the wiring surfaces for forming the wiring layer 31a.

Moreover, the chips (the chips 3 and 5) are provided on the support 27 to be the substrate of the semiconductor device and are sealed with the sealing resin 29. However, the back faces and the side surfaces of the chips 3 and 5 are covered with the bonding layers 22 and 28. Therefore, it is possible to reduce an influence of curing and contraction of the resin, thereby preventing a warpage of the sealing resin 29. Thus, it is possible to ensure a flatness of the wiring surface 29a on which the wiring layers 31a, 31b and 31c are to be formed.

In the embodiment, furthermore, various electronic components such as an IC chip (a semiconductor chip) and a chip capacitor may be provided as the chips 3 and 5.

(Third Embodiment)

Figure 17:
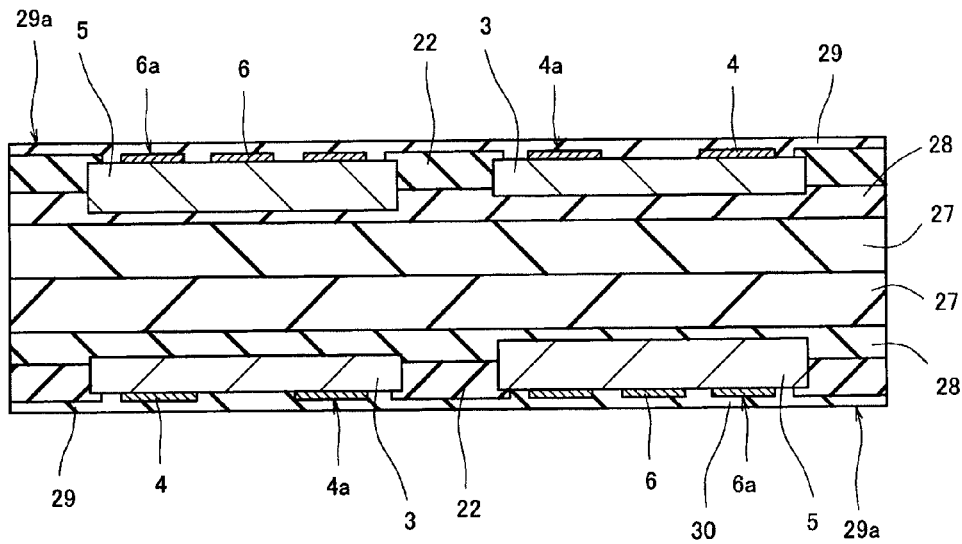
FIGS. 17 and 18 are sectional views typically showing a semiconductor device in a manufacturing process according to the embodiment according to a third embodiment of the invention.
Figure 18:
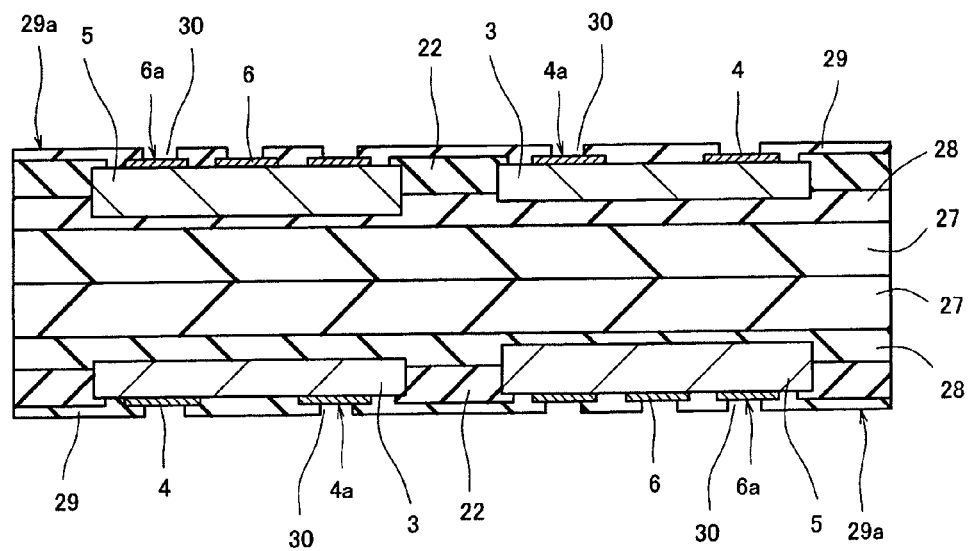
Figure 19:
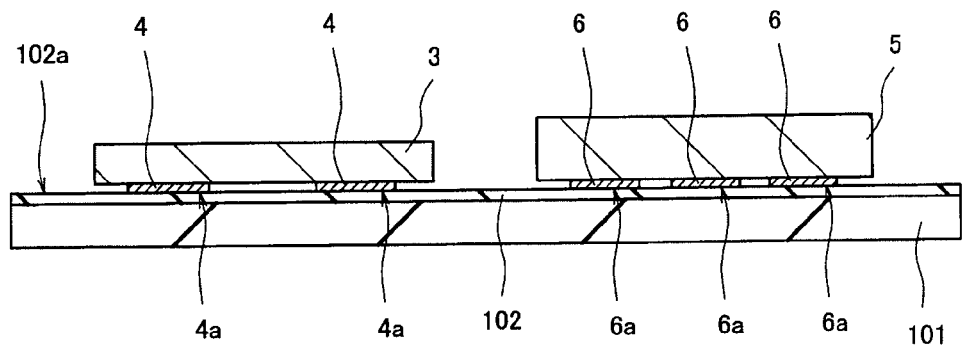
FIGS. 19 to 22 are sectional views typically showing a semiconductor device in a manufacturing process which was investigated by the inventor.
Figure 20:
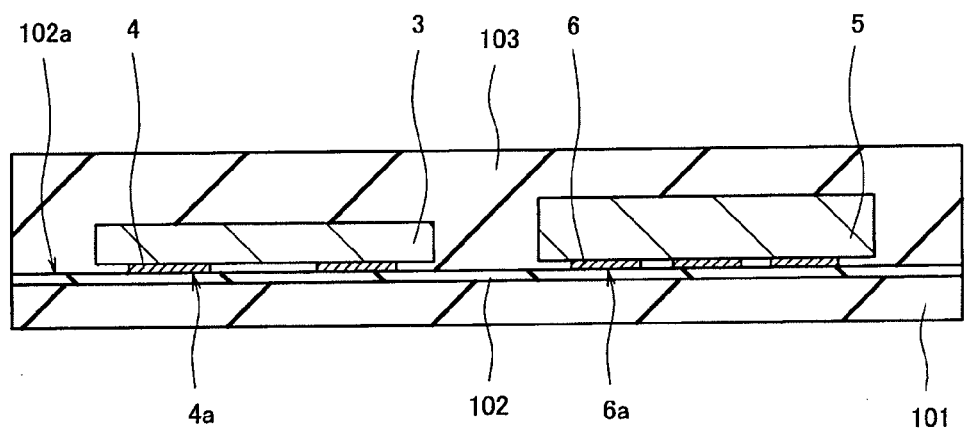

In the first and second embodiments, the description has been given to the case in which the supports 7 and 27 are applied to the substrate of the semiconductor device. In the case in which a warpage occurs over a package due to curing and contraction or expansion of the sealing resins 9 and 29 formed on the supports 7 and 27, it can be supposed that the formation of the flat wiring layers 11A and 31a is remarkably hard. The warpage of the package occurs due to an asymmetry of a structure as a principal factor. In a third embodiment, therefore, the case in which substrates of a semiconductor device are temporarily bonded at a back face will be described with reference to the drawings. FIGS. 17 and 18 are sectional views typically showing a semiconductor device in a manufacturing process according to the third embodiment.

As shown in FIG. 17, in a state in which back faces of two supports 27 subjected to the steps described with reference to FIGS. 9 to 12 in the second embodiment are provided in contact with each other as substrates of the semiconductor device, a sealing resin 29 for sealing chips 3 and 5 is formed on the upper and lower supports 27 respectively. For example, an insulating resin is coated to cover terminal surfaces 4a and 6a and is thus cured to form the sealing resin 29 for sealing the chips 3 and 5.

As shown in FIG. 18, subsequently, a through hole 30 is formed on the sealing resin 29 which is provided just above terminals 4 and 6. Consequently, it is possible to expose the terminal surfaces 4a and 6a of the chips 3 and 5. As described with reference to FIGS. 15 and 16, next, wiring layers 31a, 31b and 31c, insulating layers 32a and 32b and a solder resist 33 are formed and the two supports 27 are then separated from each other. Thus, two semiconductor devices are finished. In the semiconductor device, it is possible to connect a solder ball as an external connecting terminal onto the third wiring layer 31c to be an uppermost wiring layer.

Through the vertical symmetrical process, a warpage of the sealing resin 29 can be suppressed. Thus, it is possible to ensure a flatness of the wiring layers 31a, 31b and 31c.

The technique described in the third embodiment can also be applied to the first embodiment. In other words, the technique can also be applied to the case in which the sealing resin 9 for sealing the chips 3 and 5 is formed on two supports 7 subjected to the steps described with reference to FIGS. 1 to 3 in the first embodiment respectively in a state in which the back faces of the upper and lower supports 7 are provided in contact with each other as the substrates of the semiconductor device. Consequently, it is possible to suppress the warpage of the sealing resin 9, thereby ensuring a flatness of the wiring layers 11a, 11b and 11c.

In the third embodiment, moreover, it is also possible to provide various electronic components such as an IC chip (a semiconductor chip) and a chip capacitor as the chips 3 and 5.

Although the invention made by the inventor has specifically been described above based on the embodiments, the invention is not restricted to the embodiments but it is apparent that various changes can be made without departing from the scope thereof.

For example, although the description has been given to the case in which the invention is applied to a semiconductor device including a plurality of electronic components in the embodiments, an application as a single electronic component can be carried out if a single semiconductor chip is provided with a semiconductor device or a capacitor, for instance.

For example, although the description has been given to the case in which the terminal surfaces of the electronic components are aligned with each other over the same plane in the embodiments, moreover, the invention can also be applied to the case in which faces are to be aligned with each other on the same plane in addition to the terminal surfaces.

For example, although the description has been given to the case in which the multilayer wiring is formed on the terminal surfaces of the electronic components in the embodiments, furthermore, the invention can also be applied to the case in which a bump is formed on the terminal surface.

The invention is widely utilized in the manufacturing industry for a semiconductor device, particularly a resin sealing package.

What is claimed is:

1. A method of manufacturing a semiconductor device, comprising the following steps in order:
   (a) bonding a first terminal surface of a first terminal of a first chip and a second terminal surface of a second terminal of a second chip onto a surface of a first bonding layer provided on a flat face of a first support so that the first terminal surface and the second terminal surface are aligned with each other;
   (b) preparing a second support having a second bonding layer formed thereon and then bonding the second support onto a first back face of the first chip and a second back face of the second chip through the second bonding layer, the second bonding layer covering the first and second back faces of the first and second chips so as to absorb a difference in height between the first and second chips;
   (c) peeling the first support from the first and second chips to expose the first and second terminal surfaces of the first and second chips in a same plane in alignment with each other;
   (d) forming, on the second support, an insulating layer so as to cover the first and second terminal surfaces and at least part of side surfaces of the first and second chips;
   (e) forming an opening in the insulating layer from which at least one of the first and second terminal surfaces of the first and second chips is exposed; and
   (f) forming a wiring which is connected to at least one of the first and second terminal surfaces through the opening in the insulating layer.

2. The method of manufacturing a semiconductor device according to claim 1, wherein the second bonding layer has a greater bonding force than the first bonding layer.

3. The method of manufacturing a semiconductor device according to claim 1, further comprising a step of:
   forming a multilayer wiring on the insulating layer.

4. The method of manufacturing a semiconductor device according to claim 1, wherein a plurality of chips is provided.

5. The method of manufacturing a semiconductor device according to claim 1, further comprising:
   removing the second support.

6. A method of manufacturing a semiconductor device, comprising the following steps in order:
   (a) preparing a first support having a first bonding layer formed thereon and then bonding a chip onto a flat face of the first support through the first bonding layer with a terminal surface of the chip directly in contact with the flat face of the first support and without the terminal surface of the chip and the first bonding layer in contact with each other, the first bonding layer covering side surfaces of the chip;
   (b) preparing a second support having a second bonding layer formed thereon and then bonding the second support onto a back face of the chip through the second bonding layer, the second bonding layer covering the back face of the chip;
   (c) peeling the first support from the chip to expose the terminal surface of the chip;
   (d) forming, on the second support, an insulating layer so as to cover the terminal surface of the chip;
   (e) forming an opening in the insulating layer from which the terminal surface of the chip is exposed; and
   (f) forming a wiring which is connected to the terminal surface through the opening in the insulating layer.

7. The method of manufacturing a semiconductor device according to claim 6, wherein the second bonding layer has a greater bonding force than the first bonding layer.

8. The method of manufacturing a semiconductor device according to claim 6, further comprising a step of:
   forming a multilayer wiring on the insulating layer.

9. The method of manufacturing a semiconductor device according to claim 6, wherein a plurality of chips is provided.

10. The method of manufacturing a semiconductor device according to claim 6, further comprising:
    removing the second support.

* * * * *